US007567195B2

(12) United States Patent
Magrath

(10) Patent No.: US 7,567,195 B2
(45) Date of Patent: Jul. 28, 2009

(54) DIGITAL-TO-ANALOG CONVERTER USING SELECTED SINGLE BIT CONVERTER ELEMENTS

(75) Inventor: Anthony Magrath, Edinburgh (GB)

(73) Assignee: Wolfson Microelectronics plc, Edinburgh (GB)

(*) Notice: Subject to any disclaimer, the term of this patent is extended or adjusted under 35 U.S.C. 154(b) by 0 days.

(21) Appl. No.: 11/957,271

(22) Filed: Dec. 14, 2007

(65) Prior Publication Data

US 2008/0143572 A1 Jun. 19, 2008

(30) Foreign Application Priority Data

Dec. 18, 2006 (GB) ................................ 0625237.3

(51) Int. Cl.
*H03M 1/66* (2006.01)

(52) U.S. Cl. ...................................... 341/144; 341/151

(58) Field of Classification Search .......... 341/140-160
See application file for complete search history.

(56) References Cited

U.S. PATENT DOCUMENTS 6,583,742 B1 6/2003 Hossack
6,697,004 B1 * 2/2004 Galton et al. ............... 341/144
6,925,130 B2 * 8/2005 Chan .......................... 341/144
7,308,039 B2 * 12/2007 Chan .......................... 375/295
7,446,688 B1 * 11/2008 Yau ............................ 341/144
2003/0001764 A1 1/2003 Ruha et al.
2003/0218917 A1 11/2003 Ou
2008/0089434 A1 * 4/2008 Chan .......................... 375/295

OTHER PUBLICATIONS

O. Nys et al., "A 19-Bit Low-Power Multibit Sigma-Delta ADC Based on Data Weighted Averaging", IEEE Journal of Solid-State Circuits, vol. 32, No. 7, Jul. 1997, pp. 933-942.

* cited by examiner

*Primary Examiner*—Lam T Mai
(74) *Attorney, Agent, or Firm*—Dickstein Shapiro LLP

(57) ABSTRACT

A digital-to-analog converter having an input for receiving a digital input signal during each time period. A plurality of elements are each adapted to produce an analog output in response to an input, and an encoder selects a number of the elements and applies inputs to the selected elements. An analog output signal is then formed by summing outputs of the plurality of elements. The encoder selects the number of elements based on a value of the digital input signal, and selects the elements in a predetermined order from the plurality of elements, starting from an element determined by the elements selected in an immediately preceding time period, and excluding a temporarily omitted one of the plurality of elements.

43 Claims, 5 Drawing Sheets

DIGITAL-TO-ANALOG CONVERTER USING SELECTED SINGLE BIT CONVERTER ELEMENTS

BACKGROUND OF THE INVENTION

1. Field of the Invention

This invention relates to a digital-to-analog converter, and in particular to a digital-to-analog converter that attempts to reduce an amount of noise present in an output signal, and to a method of operation of a digital-to-analog converter.

2. Description of the Related Art

In many electronics devices, digital signals are used in order to allow signal processing operations to be performed, or to allow data to be stored in a convenient form. However, it is often necessary to use analog signals to drive, for example, analog transducers such as speakers in audio equipment. In such situations, and many others, digital-to-analog converters are used to convert a digital input signal to an analog output signal.

Digital-to-analog converters are known, in which a value of a digital input signal is used to select a number of single-bit digital-to-analog converter elements. The outputs of these single-bit digital-to-analog converter elements are then summed together, in order to produce an analog output signal.

It is also known that the single-bit digital-to-analog converter elements can be formed in a logical ring, with the element or elements selected in any time period following on consecutively from the element or elements selected in the preceding time period. The document "A 19-Bit Low-Power Multibit Sigma-Delta ADC Based on Data Weighted Averaging," Nys et al., IEEE Journal of Solid-State Circuits, Vol. 32, No. 7, July 1997, pp. 933-942 discloses a digital-to-analog converter of this type. This has the advantage that distortion is reduced because, for any given input value, different elements can be selected in different time periods. Moreover, all of the elements are selected on essentially equal numbers of occasions averaged over many time periods, reducing the low frequency components of noise introduced by possible mismatch between the elements.

However, there remains the issue that, if the same input signal is received consecutively, the group of selected elements will repeat. For example, in a case where there are eight single-bit digital-to-analog converter elements, if the value of the input signal is such that a group of four elements is to be selected, then a first group of four elements will be selected in a first time period, the four remaining elements will be selected in a second time period, and the first group of four elements will be selected again in a third time period, and the four remaining elements will be selected again in a fourth time period. In this case, the sequence repeats with a frequency of once per two time periods, leading to a tone at this frequency. Other input signal values lead in the same way to tones at other frequencies. Thus, where the input signal includes any DC component, as is typical, this will cause tones to appear in the output.

SUMMARY OF THE INVENTION

According to a first aspect of the present invention, there is provided a method of converting a digital input signal into an analog output signal, the method comprising:

during each time period:

receiving the digital input signal;

based on a value of the digital input signal, selecting a number of elements from a plurality of such elements, each of the elements being adapted to produce an analog output in response to an input;

applying inputs to the selected elements; and forming the analog output signal by summing outputs of the plurality of elements, and further comprising:

excluding a temporarily omitted one of the plurality of elements, selecting the number of elements in a predetermined order from the plurality of elements, starting from an element determined by the elements selected in an immediately preceding time period.

According to a second aspect of the present invention, there is provided a digital-to-analog converter, comprising:

an input for receiving a digital input signal during each time period;

a plurality of elements, each of the elements being adapted to produce an analog output in response to an input;

an encoder, for selecting a number of elements from the plurality of elements and applying inputs to the selected elements; and an output, for forming the analog output signal by summing outputs of the plurality of elements, wherein the encoder selects the number of elements based on a value of the digital input signal, and selecting the elements in a predetermined order from the plurality of elements, starting from an element determined by the elements selected in an immediately preceding time period, and excluding a temporarily omitted one of the plurality of elements.

According to a third aspect of the present invention, there is provided an audio device, comprising a digital-to-analog converter in accordance with the second aspect of the invention.

According to a fourth aspect of the present invention, there is provided a electronic device, including an audio device, and comprising a digital-to-analog converter in accordance with the second aspect of the invention.

According to a fifth aspect of the present invention, there is provided a computer-readable medium, comprising software code for implementing a digital-to-analog converter in accordance with the second aspect of the invention.

Embodiments of the invention may have the advantage that noise tones are shifted to higher frequencies. In particular, when the digital-to-analog converter is implemented in an audio device, such noise tones may be shifted to frequencies at which they are inaudible.

BRIEF DESCRIPTION OF THE DRAWINGS

For a better understanding of the present invention, and to show how it may be put into effect, reference will now be made, by way of example, to the accompanying drawings, in which.

DETAILED DESCRIPTION OF THE PREFERRED EMBODIMENT

Figure 1:
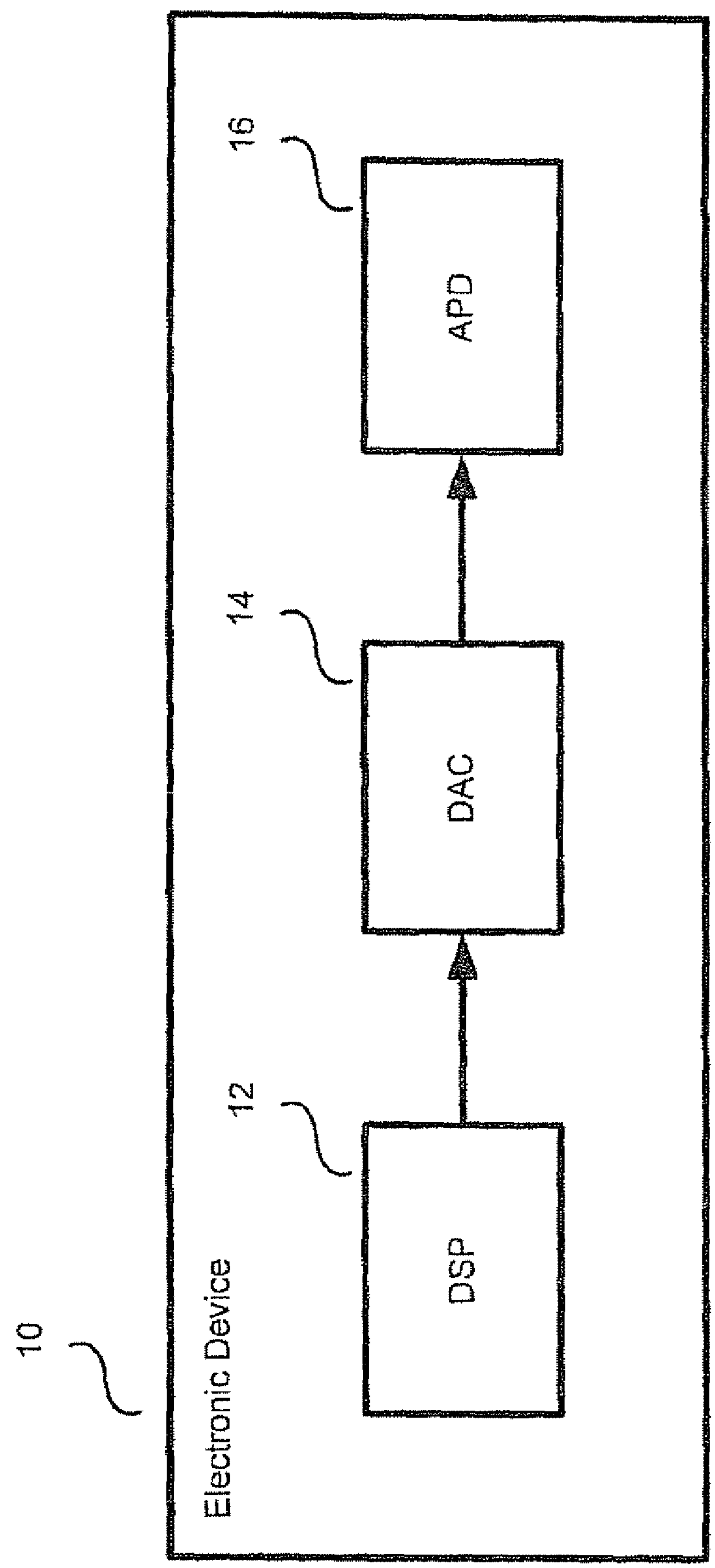
FIG. 1 is a schematic diagram, illustrating an electronic device in accordance with an aspect of the invention.

FIG. 1 is a block schematic diagram, illustrating the general form of an electronic device 10. For example, the device 10 may be an audio device, for example such as an audio reproduction device, a games machine, a DVD player, a personal computer, or the like.

Input digital data is supplied from a source (not shown) to a digital signal processor (DSP) 12, for performing a conventional digital signal processing operation on the digital data. The processed digital data is then supplied as an input signal to a digital-to-analog converter (DAC) 14, for conversion into an analog form. The resulting analog signal is supplied to an audio processing device (APD) 16, which may for example be an audio amplifier.

It will be appreciated that this type of device is just one example of many devices where digital-to-analog converters are used.

Figure 2:
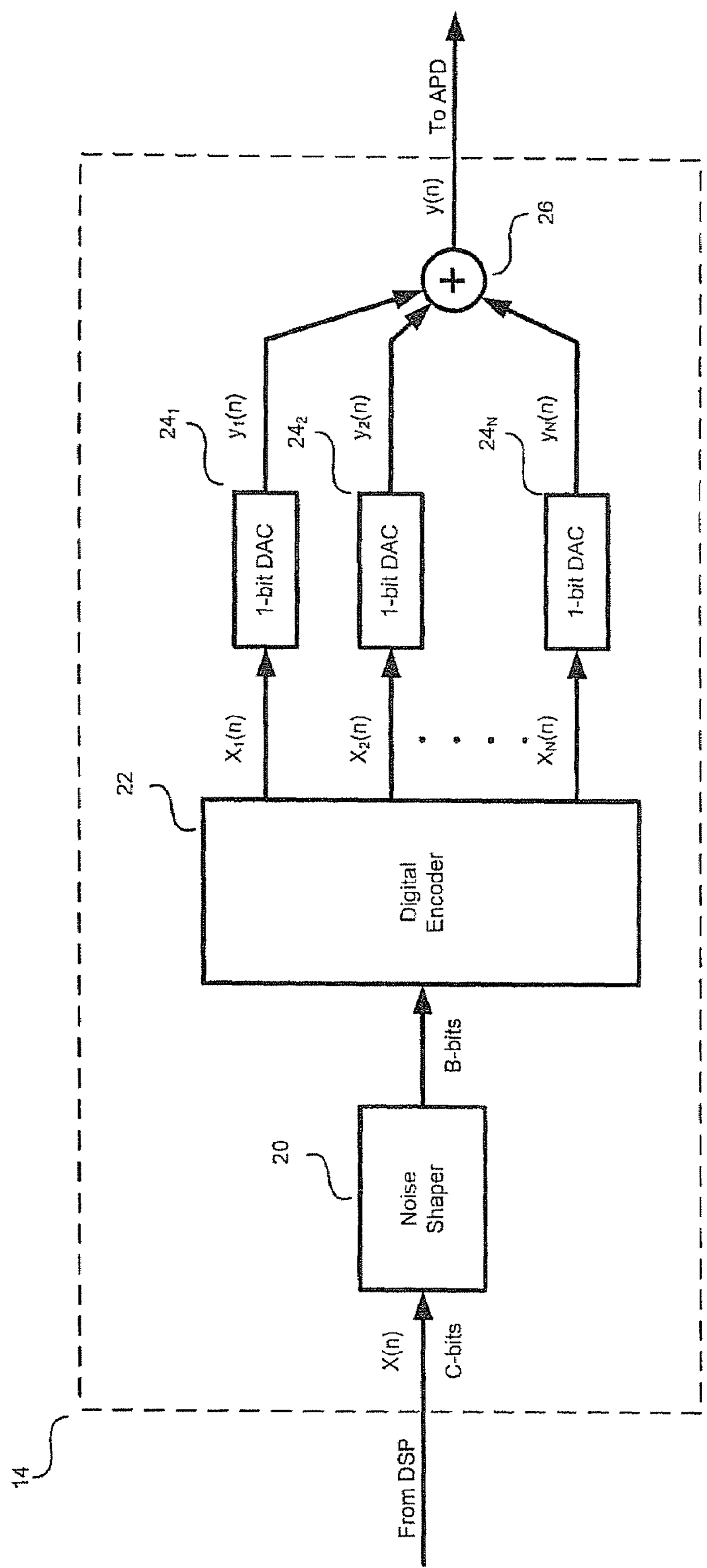
FIG. 2 is a block schematic diagram, showing a digital-to-analog converter, in accordance with an aspect of the present invention.

FIG. 2 is a block schematic diagram, illustrating the form of the digital-to-analog converter 14 in more detail. For each sample value, n, an input digital signal X(n), containing C bits in each sample value, is applied to a noise shaper 20, which reduces the length of each data word, from C bits to B bits in this illustrated case. This truncation reduces the complexity of the overall circuit, and the noise-shaping ensures that quantization noise introduced by the truncation process is reduced in the baseband, at the expense of higher noise at higher frequencies. The noise-shaper takes the form of a sigma-delta modulator (SDM) in this embodiment of the invention. The truncated word length, B bits, may for example be in the range of 3 to 6 bits, and the invention will be further described with reference to an example in which B is 3.

The reduced length digital signal is supplied as an input to a digital encoder 22.

The digital encoder 22 then supplies one-bit digital signals $X_1(n), X_2(n), \ldots, X_N(n)$ to each of N one-bit digital-to-analog converters $\mathbf{24}_1, \mathbf{24}_2, \ldots, \mathbf{24}_N$. The one-bit digital-to-analog converters $\mathbf{24}_1, \mathbf{24}_2, \ldots, \mathbf{24}_N$ produce respective analog outputs $y_1(n), y_2(n), \ldots, y_N(n)$. Where the one-bit digital signals $X_1(n), X_2(n), \ldots, X_N(n)$ are logic "1"s, the respective analog outputs $y_1(n), y_2(n), \ldots, y_N(n)$ take high voltage levels and, where the one-bit digital signals $X_1(n), X_2(n), \ldots, X_N(n)$ are logic "0"s, the respective analog outputs $y_1(n), y_2(n), \ldots, y_N(n)$ take low voltage levels. In this illustrated example, the one-bit digital-to-analog converters $\mathbf{24}_1, \mathbf{24}_2, \ldots, \mathbf{24}_N$ produce equal high level analog outputs, although one of the issues with a device of this type is that there is almost inevitably some degree of mismatch between each of the one-bit digital-to-analog converters $\mathbf{24}_1, \mathbf{24}_2, \ldots, \mathbf{24}_N$, causing them to produce unequal high level analog outputs.

The one-bit digital-to-analog converters $\mathbf{24}_1, \mathbf{24}_2, \ldots, \mathbf{24}_N$ can for example be switched current sources, or switched-capacitor elements, or any other type of DAC element.

The analog outputs $y_1(n), y_2(n), \ldots, y_N(n)$ of the one-bit digital-to-analog converters $\mathbf{24}_1, \mathbf{24}_2, \ldots, \mathbf{24}_N$ are applied to summing circuitry 26 to form a single analog output signal Y(n).

In this illustrated embodiment, the digital encoder 22 is a binary-to-thermometer code converter. That is, the value of the digital input signal into the digital encoder 22 is converted into a number, and the digital encoder 22 then produces high level output signals, i.e. binary "1"s, on a corresponding number of its outputs.

The number of outputs from the digital encoder 22, that is, the number of one-bit digital-to-analog converters $\mathbf{24}_1, \mathbf{24}_2, \ldots, \mathbf{24}_N$, depends on the number of possible values for the digital input signal into the digital encoder 22. In the illustrated example where the digital input signal into the digital encoder 22 is a 3-bit signal, it has 8 possible values, and so there are 8 one-bit digital-to-analog converters $\mathbf{24}_1, \mathbf{24}_2, \ldots, \mathbf{24}_N$ in this example: where N=8.

Figure 3:
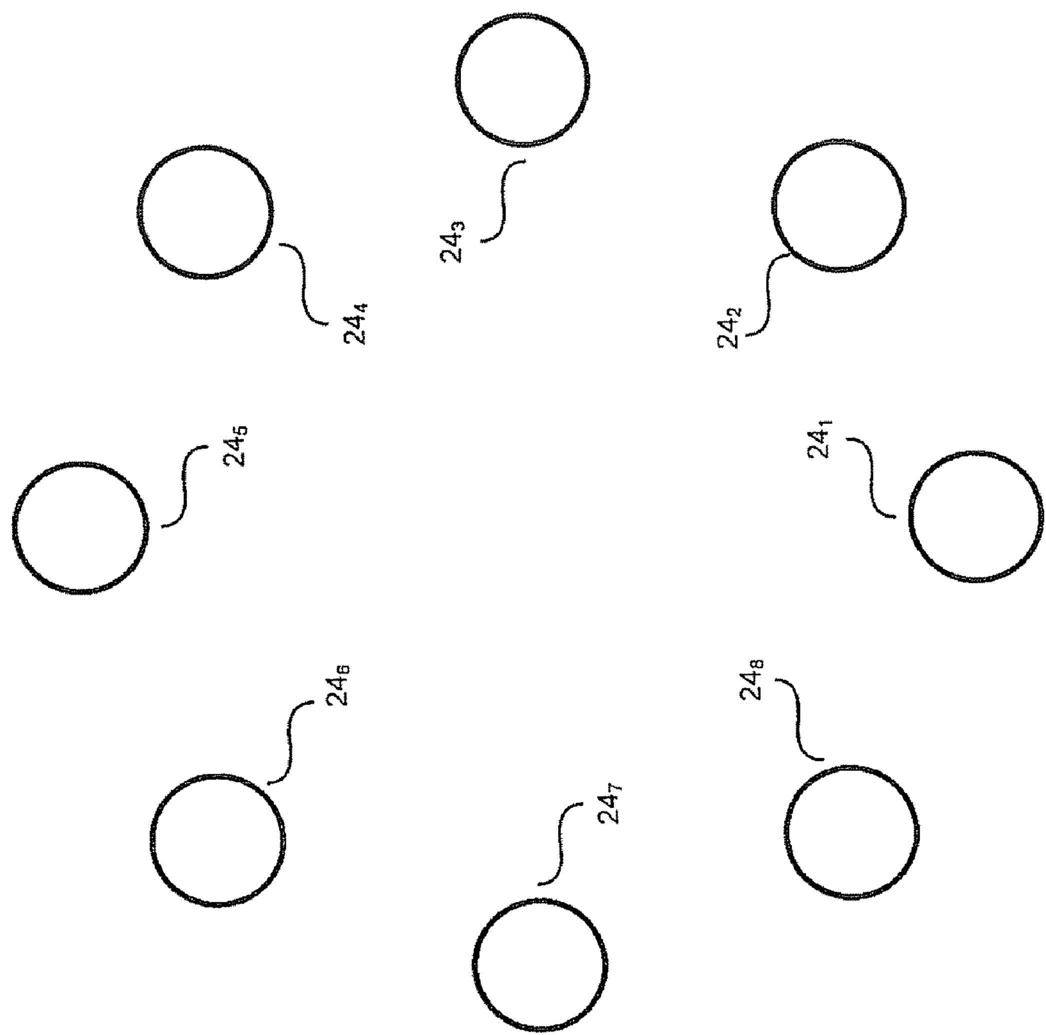
FIG. 3 illustrates a logical arrangement of one-bit converters, in the device of FIG. 2.

FIG. 3 illustrates the logical arrangement of the elements, $\mathbf{24}_1, \mathbf{24}_2, \ldots, \mathbf{24}_8$ in this example. Specifically, the elements $\mathbf{24}_1, \mathbf{24}_2, \ldots, \mathbf{24}_8$ are arranged in a logical ring. As will be described in more detail below, the elements are selected by moving around the ring. When an element is selected, its associated digital-to-analog converter will take a high level.

Figure 4:
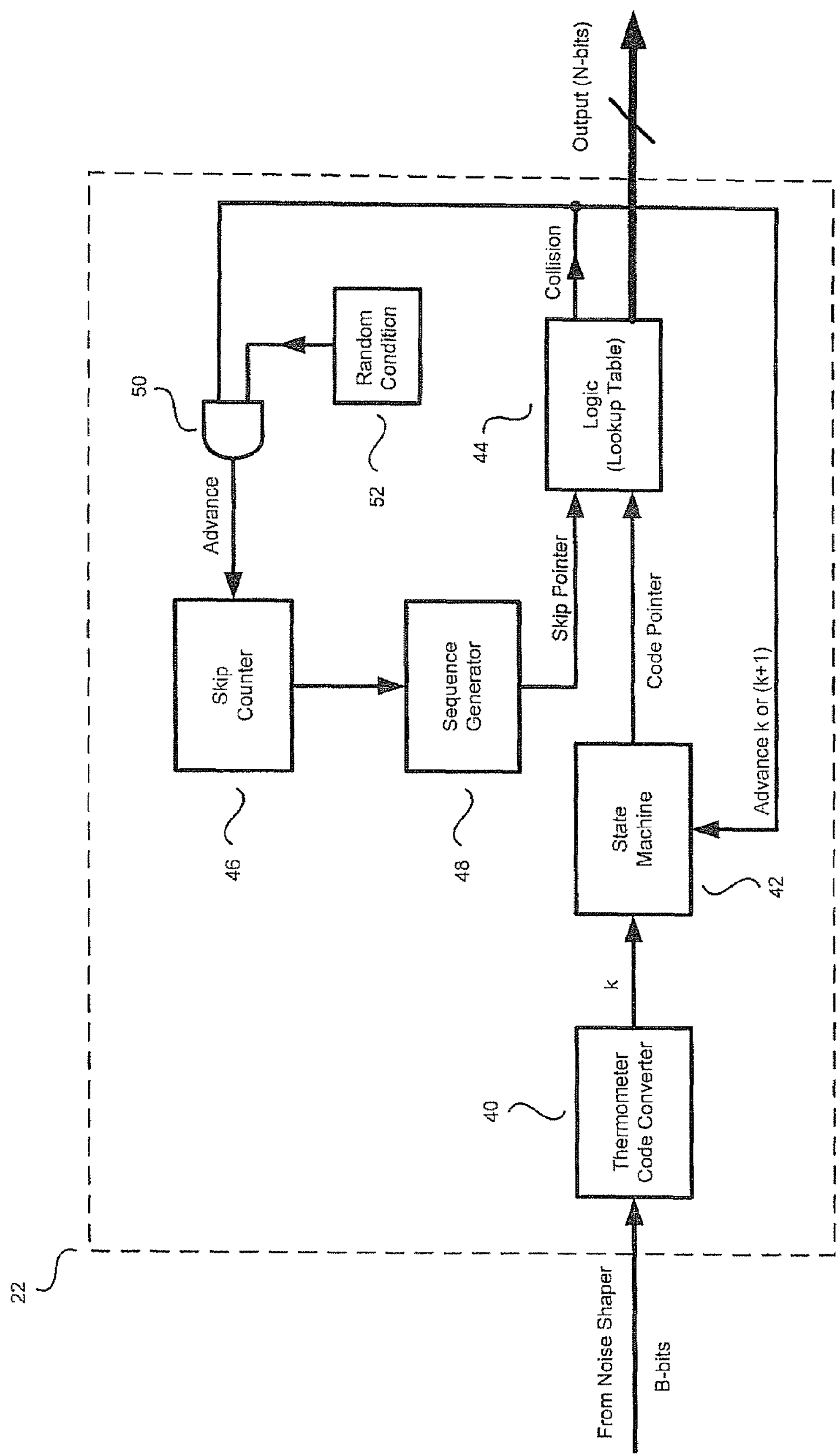
FIG. 4 is a block schematic diagram, illustrating in more detail the digital encoder in the device of FIG. 2.

FIG. 4 is a schematic diagram, illustrating the form of the digital encoder 22, in an embodiment of the invention. According to an aspect of the invention, one of the one-bit digital-to-analog converters $\mathbf{24}_1, \mathbf{24}_2, \ldots, \mathbf{24}_N$ is designated as a skip element during each sample period. Then, the digital encoder determines the appropriate number of elements to be selected, based on the value of its received input digital signal. That number of elements is then selected, counting consecutively from the element or elements selected in the immediately preceding sample period, but omitting the skip element.

In alternative embodiments of the invention, the elements may not be selected consecutively, but may instead be selected in some other predetermined order. Moreover, this predetermined order can change periodically.

In the digital encoder 22 shown in FIG. 4, the B-bit output from the noise shaper 20 is applied to a thermometer code converter 40, in order to generate the number k of elements to be selected, and this is applied to a state machine 42. The operation of the state machine will be described in more detail below.

An output of the state machine 42 takes the form of a code pointer, which is applied to a lookup table logic block 44, and generates an output comprising N bits $[X_1(n), X_2(n), \ldots, X_N(n)]$ in parallel, which are applied to the one-bit digital-to-analog converters $\mathbf{24}_1, \mathbf{24}_2, \ldots, \mathbf{24}_N$ respectively. The code pointer selects the start position in the logical ring from which the elements are to be selected.

A skip counter 46 generates an output, and this is passed to a sequence generator 48 for generating a skip pointer. The skip pointer indicates the skip element, as mentioned above, during a particular sample period, and this is also applied to the logic block 44. The skip counter 46 and the sequence generator 48 can be implemented, for example, in a single state machine.

When the logic block 44 determines that there has been a collision between the selected elements and the skip element, a collision output flag is applied to the state machine 42. The collision flag signals to the state machine to advance the code pointer one extra location if a collision occurs. The collision output flag is also applied to an AND gate 50. A random condition generator 52 is connected to a second input of the AND gate 50, and the output of the AND gate 50 is applied to an input of the skip counter 46. If the output of the AND gate 50 is high, the skip counter 46 will advance one count, otherwise the skip counter value will not change. The random condition generator 52 can include a pseudorandom pattern generator, for example in the form of a linear feedback shift register, which generates a pseudorandom sequence of values. The random condition generator 52 can then further include a comparator (not illustrated), such that it outputs a high level binary signal only when the present value from that sequence exceeds a constant threshold value.

The AND gate 50 then produces a high level binary output signal only when the collision flag and the output of the random condition generator 52 are both high.

It should be noted that, if all N outputs from the thermometer encoder 40 are high, the skip pointer location should not be skipped. This is handled by the logic block 44. That is, when all N outputs from the thermometer encoder 40 are high, the collision output from the logic block 44 is held low, to prevent the skip counter being advanced.

Figure 5:
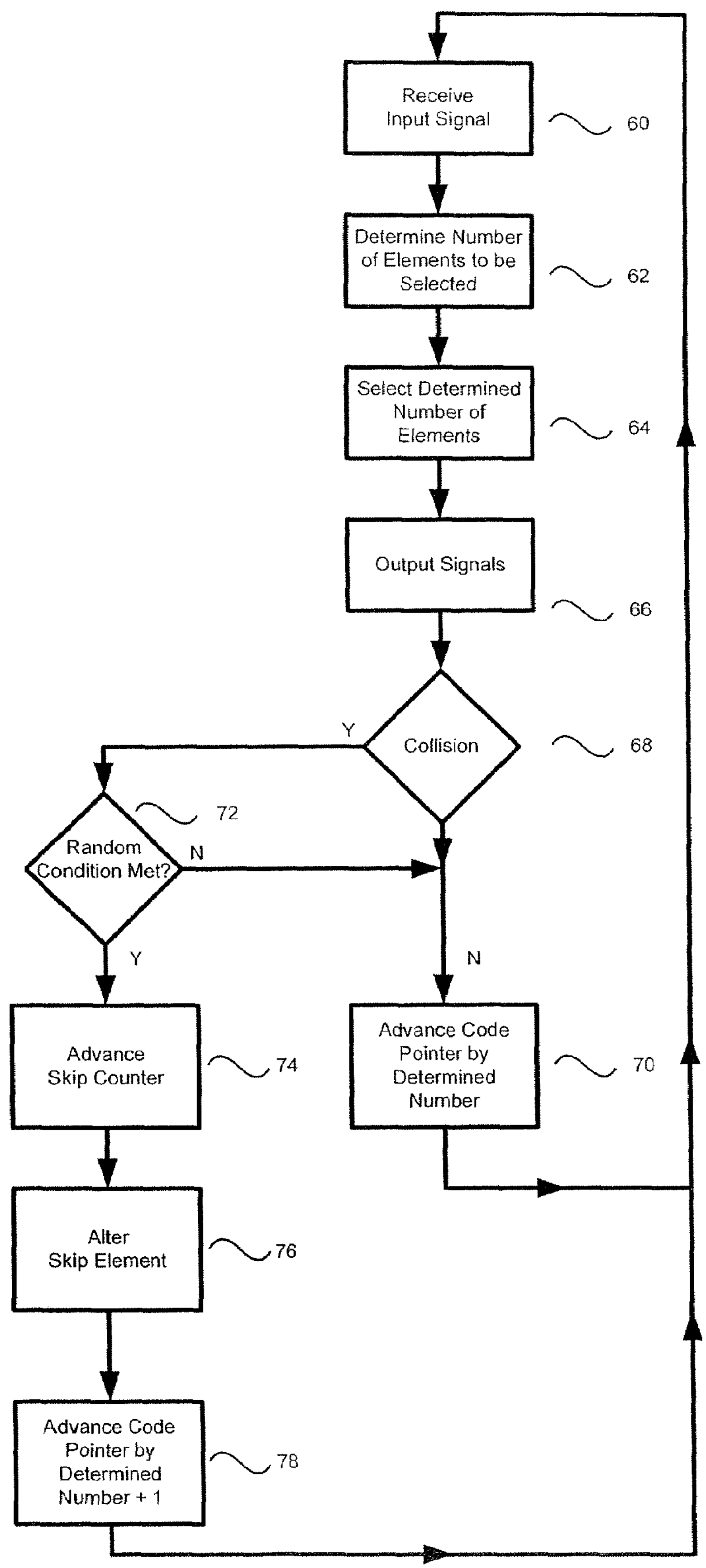
FIG. 5 is a flow chart, illustrating a method in accordance with an aspect of the invention.

FIG. 5 is a flow chart, illustrating the process performed in the digital encoder 22, for generating the N-bit parallel output of the logic block 44.

In step 60, the B-bit output from the noise shaper 20 is received and, in step 62, the thermometer code converter 40 determines from the value of this signal the number k of elements to be selected.

In step 64, this determined number k of elements is selected. A code counter value is initialized when operation begins, and can be altered during each subsequent sample period, and indicates the first element to be selected. As shown in FIG. 3, the elements are arranged in a logical ring, and the first element to be considered during one sample period is the element immediately following the last element used during the previous sample period.

During each sample period, one of the elements is designated as the skip element, and therefore the elements to be selected in one sample period are the ones immediately succeeding the elements selected in the preceding sample period, but omitting the skip element. For example, if the elements selected during the preceding sample period were the elements $\mathbf{24}_1$ and $\mathbf{24}_2$, and the skip element is the element $\mathbf{24}_5$, and the thermometer code k indicates that four elements are to be selected, they should be the elements $\mathbf{24}_3$, $\mathbf{24}_4$, $\mathbf{24}_6$ and $\mathbf{24}_7$.

In step 66, signals are then output to the one-bit digital-to-analog converters $\mathbf{24}_1, \mathbf{24}_2, \ldots, \mathbf{24}_N$. As described above, high level binary signals are applied to the selected elements, and low level binary signals are applied to the non-selected elements, and the outputs of the elements are summed to form the output analog signal Y(n).

In step 68, it is determined whether a collision occurred. That is, it is determined whether the skip element would have been selected, had it not been designated as the skip element during that sample period. If no collision occurred, the process advances to step 70, in which the code pointer is advanced by the determined number of elements, in order to indicate which should be the first element selected during the next sample period.

The process then ends, and awaits the next input signal during the next sample period.

If it is determined in step 68 that a collision occurred, the process passes to step 72, in which it is determined whether a random condition is met. As described above, the random condition can be based on a determination as to whether a current value from a pseudorandom sequence exceeds a preset threshold (or alternatively whether it falls below the preset threshold).

If the random condition is met, the process passes to step 74, in which the skip counter is advanced, and step 76, in which the skip element is altered in time for the next sample period. In one embodiment, in the event of an alteration, the new skip element is the element immediately following the previous skip element. In other embodiments, the new skip element is the element immediately preceding the previous skip element. In other embodiments, the sequence of skip elements can be a non-consecutive sequence of the elements. Moreover, the sequence of skip elements can vary periodically.

The process then passes to step 78, in which the code pointer is advanced by the determined number of elements, plus one, to take account of the fact that the skip element was omitted, in order to indicate which should be the first element selected during the next sample period.

The process then ends, and awaits the next input signal during the next sample period.

If it is determined in step 72 that the random condition is not met, the process immediately passes to step 70, which is as described above.

In another embodiment of the invention, there is no test whether a random condition is met, and the skip counter advances whenever a collision occurs.

The operation of the invention will be illustrated with reference to some illustrative examples.

In the following tables, each line of the table represents the position in a particular sample period, and the eight symbols in the "elements" column represent the positions of the eight one-bit digital-to-analog converter elements $\mathbf{24}_1, \mathbf{24}_2, \ldots, \mathbf{24}_8$, while the value in the "skip pointer" column indicates which of the elements is the skip element during that sample period. A "1" indicates that a high level binary signal is applied to that element, a "0" indicates that a low level binary signal is applied to that element, a "X" indicates that the element is the skip element, and a "Z" indicates that the element is the skip element and that a collision occurs.

For ease of explanation, these examples relate to an embodiment where there is no test whether a random condition is met, and the skip counter advances whenever a collision occurs, and where, in the event of an alteration, the new skip element is the element immediately following the previous skip element.

Table A illustrates the sequence of events where the input signal has the value 4 in successive sample periods.

TABLE A

| Elements | Skip pointer |
|---|---|
| Z1111000 | 1 |
| 1X000111 | 2 |
| 0Z111100 | 2 |
| 11X00011 | 3 |
| 00Z11110 | 3 |
| 111X0001 | 4 |
| 000Z1111 | 4 |
| 1111X000 | 5 |
| 1000Z111 | 5 |
| 01111X00 | 6 |
| 11000Z11 | 6 |
| 001111X0 | 7 |
| 111000Z1 | 7 |
| 0001111X | 8 |
| 1111000Z | 8 |
| X0001111 | 1 |
| Z1111000 | 1 |

Table B illustrates the sequence of events where the input signal has the value 2 in successive sample periods.

TABLE B

| Elements | Skip pointer |
|---|---|
| Z1100000 | 1 |
| 0X011000 | 2 |
| 0X000110 | 2 |
| 1X000001 | 2 |
| 0Z110000 | 2 |
| 00X01100 | 3 |
| 00X00011 | 3 |
| 11X00000 | 3 |
| 00Z11000 | 3 |
| 000X0110 | 4 |
| 100X0001 | 4 |
| etc | |

Table C illustrates the sequence of events where the input signal has the value 6 in successive sample periods.

TABLE C

| Elements | Skip pointer |
|---|---|
| Z1111110 | 1 |
| 1Z111101 | 2 |
| 11Z11011 | 3 |
| 111X0111 | 4 |
| 110Z1111 | 4 |
| 1011Z111 | 5 |
| 01111Z11 | 6 |
| 111111X0 | 7 |
| 111110Z1 | 7 |
| 1111011Z | 8 |
| etc | |

It can be shown from these examples that, where the input signal has a low amplitude DC bias, there is an associated tone in a frequency region centred on the frequency $F_s/2N$, where $F_s$ is the sampling frequency, and N is the number of elements. By contrast, if the skip counter is not used, such tones appear in a frequency region centred on DC. Tones in the frequency region centred on DC are in the audio band, and hence potentially audible, whereas tones in the frequency region centred on the frequency $F_s/2N$ are inaudible, as long as the DEM oversampling ratio is greater than N.

As mentioned above, these examples illustrate a case where there is no randomization, and the skip counter advances whenever a collision occurs. Adding the randomization, as described above, has the effect of randomizing the frequency of the skip rotation, so that any tones arising from the skip rotation period are reduced in amplitude.

As described above, there is a skip counter which, at any given time, identifies one of the elements to be omitted when selecting the elements to which inputs are to be applied. In other embodiments of the invention, there may be two (or more) such skip counters, each identifying an element to be omitted when selecting the elements to which inputs are to be applied. In that case, the skip counters may operate entirely independently of one another, identifying their respective elements by the same method or different methods, or may be linked in some way.

There are thus described digital-to-analog converters which produce an output signal with advantageous properties. For example, because the skip element is altered, and each element becomes the skip element an equal number of times, the low-frequency signal-to-noise ratio of the signal is maintained. Moreover, the introduction of the skip location changes the frequency of resulting tones, causing them to be shifted to a higher frequency, where they may not affect the signal in an audible way.

The skilled person will recognise that the above-described apparatus and methods may be embodied as processor control code, for example on a carrier medium such as a disk, CD- or DVD-ROM, programmed memory such as read only memory (Firmware), or on a data carrier such as an optical or electrical signal carrier. For many applications, embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re-)programmable analog array or similar device in order to configure analog hardware.

What is claimed is:

1. A method of converting a digital input signal into an analog output signal, the method comprising:
during each time period:
receiving the digital input signal;
based on a value of the digital input signal, selecting a number of elements from a plurality of such elements, each of said elements being adapted to produce an analog output in response to an input;
applying inputs to the selected elements; and
forming the analog output signal by summing outputs of said plurality of elements, and further comprising:
excluding a temporarily omitted one of said plurality of elements, selecting said number of elements in a predetermined order from said plurality of elements, starting from an element determined by the elements selected in an immediately preceding time period.

2. A method as claimed in claim 1, wherein said elements comprise one-bit digital to analog converter elements.

3. A method as claimed in claim 1, wherein said elements form a logical ring, and the step of selecting said elements in a predetermined order comprises selecting said elements consecutively around the ring.

4. A method as claimed in claim 1, wherein said plurality of elements comprises a number of elements that is greater than a maximum value of the digital input signal.

5. A method as claimed in claim 1, wherein said plurality of elements comprises a number of elements that is equal to a maximum value of the digital input signal, and wherein, when the value of the digital input signal is equal to the maximum value thereof, no element is omitted from the said plurality of elements when selecting said elements.

6. A method as claimed in claim 1, further comprising temporarily omitting each of said plurality of elements in turn in a predetermined order.

7. A method as claimed in claim 6, further comprising temporarily omitting each of said plurality of elements in a consecutive order.

8. A method as claimed in claim 1, further comprising temporarily omitting each of said plurality of elements in turn in a non-consecutive order.

9. A method as claimed in claim 1, further comprising, when selecting said number of elements from said plurality of elements, also excluding a temporarily omitted second one of said plurality of elements.

10. A method as claimed in claim 1, further comprising, when selecting said number of elements from said plurality of elements, also excluding a temporarily omitted second one of said plurality of elements.

11. A digital-to-analog converter, comprising:
an input for receiving a digital input signal during each time period;
a plurality of elements, each of said elements being adapted to produce an analog output in response to an input;
an encoder, for selecting a number of elements from said plurality of elements and applying inputs to the selected elements; and
an output, for forming the analog output signal by summing outputs of said plurality of elements,
wherein the encoder selects the number of elements based on a value of the digital input signal, and selecting said elements in a predetermined order from said plurality of elements, starting from an element determined by the elements selected in an immediately preceding time period, and excluding a temporarily omitted one of said plurality of elements.

12. A digital-to-analog converter as claimed in claim 11, wherein said elements comprise one-bit digital-to-analog converter elements.

13. A digital-to-analog converter as claimed in claim 11, wherein said elements form a logical ring, and the encoder is adapted to select said elements consecutively around the ring.

14. A digital-to-analog converter as claimed in claim 11, wherein said plurality of elements comprises a number of elements that is greater than a maximum value of the digital input signal.

15. A digital-to-analog converter as claimed in claim 11, wherein said plurality of elements comprises a number of elements that is equal to a maximum value of the digital input signal, and wherein, when the value of the digital input signal is equal to the maximum value thereof, the encoder is adapted to omit no element from the said plurality of elements when selecting said elements.

16. A digital-to-analog converter as claimed in claim 11, wherein the encoder is adapted to temporarily omit each of said plurality of elements in turn in a predetermined order.

17. A digital-to-analog converter as claimed in claim 16, wherein the encoder is adapted to temporarily omit each of said plurality of elements in a consecutive order.

18. A digital-to-analog converter as claimed in claim 11, wherein the encoder is adapted to temporarily omit each of said plurality of elements in turn in a non-consecutive order.

19. A digital-to-analog converter as claimed in claim 11, wherein the encoder is adapted, when selecting said number of elements from said plurality of elements, also to exclude a temporarily omitted second one of said plurality of elements.

20. An audio device, comprising a digital-to-analog converter as claimed in claim 11.

21. An electronic device, including an audio device, and comprising a digital-to-analog converter as claimed in claim 11.

22. A computer-readable medium, comprising software code for implementing a digital-to-analog converter as claimed in claim 11.

23. A method of converting a digital input signal into an analog output signal, the method comprising:

during each time period:

receiving the digital input signal;

based on a value of the digital input signal, selecting a number of elements from a plurality of such elements, each of said elements being adapted to produce an analog output in response to an input;

applying inputs to the selected elements; and forming the analog output signal by summing outputs of said plurality of elements, and further comprising:

selecting said number of elements in a predetermined order from said plurality of elements, starting from an element determined by the elements selected in an immediately preceding time period and excluding a temporarily omitted one of said plurality of elements wherein the temporarily omitted element is changed in a time period only if a random condition is met.

24. A method as claimed in claim 23, wherein said elements comprise one-bit digital to analog converter elements.

25. A method as claimed in claim 23, wherein said elements form a logical ring, and the step of selecting said elements in a predetermined order comprises selecting said elements consecutively around the ring.

26. A method as claimed in claim 23, wherein said plurality of elements comprises a number of elements that is greater than a maximum value of the digital input signal.

27. A method as claimed in claim 23, wherein said plurality of elements comprises a number of elements that is equal to a maximum value of the digital input signal, and wherein, when the value of the digital input signal is equal to the maximum value thereof, no element is omitted from the said plurality of elements when selecting said elements.

28. A method as claimed in claim 23, further comprising changing the temporarily omitting one of said plurality of elements in a predetermined order if the random condition is met.

29. A method as claimed in claim 28, further comprising changing the temporarily omitting one of said plurality of elements in a consecutive order if the random condition is met.

30. A method as claimed in claim 23, further comprising changing the temporarily omitting one of said plurality of elements in a non-consecutive order if the random condition is met.

31. A digital-to-analog converter, comprising:

an input for receiving a digital input signal during each time period;

a plurality of elements, each of said elements being adapted to produce an analog output in response to an input;

an encoder, for selecting a number of elements from said plurality of elements and applying inputs to the selected elements; and an output, for forming the analog output signal by summing outputs of said plurality of elements, wherein the encoder selects the number of elements based on a value of the digital input signal, and selecting said elements in a predetermined order from said plurality of elements, starting from an element determined by the elements selected in an immediately preceding time period, and excluding a temporarily omitted one of said plurality of elements, wherein the encoder is adapted to change the temporarily omitted element in a time period, only if a random condition is met.

32. A digital-to-analog converter as claimed in claim 31, wherein said elements comprise one-bit digital-to-analog converter elements.

33. A digital-to-analog converter as claimed in claim 31, wherein said elements form a logical ring, and the encoder is adapted to select said elements consecutively around the ring.

34. A digital-to-analog converter as claimed in claim 31, wherein said plurality of elements comprises a number of elements that is greater than a maximum value of the digital input signal.

35. A digital-to-analog converter as claimed in claim 31, wherein said plurality of elements comprises a number of elements that is equal to a maximum value of the digital input signal, and wherein, when the value of the digital input signal is equal to the maximum value thereof, the encoder is adapted to omit no element from the said plurality of elements when selecting said elements.

36. A digital-to-analog converter as claimed in claim 31, wherein the encoder is adapted to change the temporarily omitted one of said plurality of elements in a predetermined order if the random condition is met.

37. A digital-to-analog converter as claimed in claim 36, wherein the encoder is adapted to change the temporarily omitted one of said plurality of elements in a consecutive order if the random condition is met.

38. A digital-to-analog converter as claimed in claim 31, wherein the encoder is adapted to change the temporarily omitted one of said plurality of elements in a non-consecutive order if the random condition is met.

39. A digital-to-analog converter as claimed in claim 31, wherein the encoder is adapted, when selecting said number of elements from said plurality of elements, also to exclude a temporarily omitted second one of said plurality of elements.

40. A method of converting a digital input signal into an analog output signal, the method comprising:

during each time period:

receiving the digital input signal;

based on a value of the digital input signal, selecting a number of elements from a plurality of such elements, each of said elements being adapted to produce an analog output in response to an input;

applying inputs to the selected elements; and forming the analog output signal by summing outputs of said plurality of elements, and further comprising:

selecting said number of elements in a predetermined order from said plurality of elements, starting from an element determined by the elements selected in an immediately preceding time period and excluding a temporarily omitted one of said plurality of elements wherein the temporarily omitted element is selected according to a sequence, said sequence varying periodically.

41. A method as claimed in claim 40, wherein said sequence is non-consecutive.

42. A digital-to-analog converter, comprising:

an input for receiving a digital input signal during each time period;

a plurality of elements, each of said elements being adapted to produce an analog output in response to an input;

an encoder, for selecting a number of elements from said plurality of elements and applying inputs to the selected elements; and an output, for forming the analog output signal by summing outputs of said plurality of elements, wherein the encoder selects the number of elements based on a value of the digital input signal, and selecting said elements in a predetermined order from said plurality of elements, starting from an element determined by the elements selected in an immediately preceding time period, and excluding a temporarily omitted one of said plurality of elements, wherein the encoder is adapted to change the temporarily omitted element according to a sequence, said sequence varying periodically.

43. A digital-to-analog converter as claimed in claim 42, wherein said sequence is non-consecutive.

* * * * *